United States Patent
Schoner

(10) Patent No.: US 7,224,304 B2
(45) Date of Patent: May 29, 2007

(54) METHOD AND APPARATUS FOR AN IMAGE CANCELING DIGITAL-TO-ANALOG CONVERTER (DAC)

(75) Inventor: Brian F. Schoner, Fremont, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/356,768

(22) Filed: Feb. 17, 2006

(65) Prior Publication Data

US 2006/0139197 A1 Jun. 29, 2006

Related U.S. Application Data

(63) Continuation of application No. 10/920,500, filed on Aug. 18, 2004, now Pat. No. 7,023,371.

(60) Provisional application No. 60/561,332, filed on Apr. 12, 2004.

(51) Int. Cl.
 *H03M 1/66* (2006.01)
(52) U.S. Cl. ........................ 341/144; 341/143
(58) Field of Classification Search ................ 341/144, 341/143, 152
 See application file for complete search history.

(56) References Cited

U.S. PATENT DOCUMENTS

| | | | |
|---|---|---|---|
| 4,415,914 A | 11/1983 | Giordano et al. | |
| 5,155,743 A * | 10/1992 | Jacobs | 375/247 |
| 5,585,802 A * | 12/1996 | Cabler et al. | 341/144 |
| 5,621,675 A * | 4/1997 | Linz et al. | 708/313 |
| 5,646,621 A * | 7/1997 | Cabler et al. | 341/143 |
| 5,684,482 A | 11/1997 | Galton | |
| 5,748,126 A | 5/1998 | Ma et al. | |
| 6,150,970 A | 11/2000 | Anagnos | |
| 6,476,746 B2 | 11/2002 | Viswanathan | |
| 6,489,908 B2 | 12/2002 | Panasik et al. | |
| 6,535,154 B1 * | 3/2003 | Sculley | 341/143 |
| 6,546,057 B1 * | 4/2003 | Yeap | 375/285 |
| 6,603,418 B2 | 8/2003 | Al-Awadhi | |
| 6,603,804 B1 | 8/2003 | Khoini-Poorfard et al. | |
| 6,727,832 B1 | 4/2004 | Melanson | |
| 6,737,999 B2 | 5/2004 | Schreier | |
| 2005/0225472 A1 | 10/2005 | Schoner | |

* cited by examiner

*Primary Examiner*—Jean Bruner Jeanglaude
(74) *Attorney, Agent, or Firm*—McAndrews, Held & Malloy, Ltd.

(57) ABSTRACT

A method and apparatus for an image canceling digital-to-analog converter is disclosed. Up-sampling and noise shaping is used to produce a stream of digital sample values at a relatively higher sampling rate than the sampling rate of the digitized input samples, each higher sampling rate sample having fewer bits than the original samples. The higher sampling rate stream is then distributed for sequential conversion by multiple digital-to-analog converters each operating at a lower sampling rate. The outputs of the converters are then combined to form a combined output signal. Most spectral images normally observed in a standard or conventional DAC are attenuated in the combined output signal of an embodiment in accordance with the present invention. Any spectral images that remain are further from the signal of interest, permitting the use of lower cost filtering.

31 Claims, 10 Drawing Sheets

METHOD AND APPARATUS FOR AN IMAGE CANCELING DIGITAL-TO-ANALOG CONVERTER (DAC)

RELATED APPLICATIONS

This application is a continuation of prior U.S. patent application Ser. No. 10/920,500, entitled "METHOD AND APPARATUS FOR AN IMAGE CANCELING DIGITAL-TO-ANALOG (DAC)", filed Aug. 18, 2004, now U.S. Pat. No. 7,023,371, which makes reference to, claims priority to, and claims the benefit of U.S. Provisional Patent Application Ser. No. 60/561,332, entitled "METHOD AND APPARATUS FOR AN IMAGE CANCELING DIGITAL-TO-ANALOG (DAC)", filed Apr. 12, 2004, the complete subject matter of each of which is hereby incorporated herein by reference, in its entirety.

FEDERALLY SPONSORED RESEARCH OR DEVELOPMENT

[Not Applicable]

[MICROFICHE/COPYRIGHT REFERENCE]

[Not Applicable]

BACKGROUND OF THE INVENTION

Images are a common problem when digital-to-analog converters (DACs) are employed to reproduce analog waveforms. In general, DACs have a zero-order hold output. If samples representing a signal having a frequency, F, are applied to a zero-order hold DAC clocked at a sample frequency, $F_s$, the output will have spectral images at $(F+/-kF_s)$, for every integer k. FIG. 1A illustrates some of the problems associated with spectral images for a DAC of conventional design. Referring to FIG. 1A, digitized samples of a signal having a frequency F=1 MHz are applied to a zero-order hold DAC clocked at a sampling frequency (150) of $F_s$=8 MHz. The resulting spectral images are illustrated at (8−1) MHz (141) and (8+1) MHz (142), as well as (16−1) MHz (143) and (16+1) MHz (144). The amplitudes of the spectral images have a slow sinc roll-off (not shown). For the example of FIG. 1A, the 1 MHz sinusoidal signal sampled at an 8 MHz sampling frequency (150) has spectral images at 7 MHz (141), 9 MHz (142), 15 MHz (143), 17 MHz (144), and so on. One conventional method of removing the spectral images involves filtering the output of the DAC using a low-pass filter, as shown in FIG. 1B.

FIG. 1B illustrates suppression of the spectral images shown in FIG. 1A, by employing passband filtering of the output of a DAC of conventional design. Referring to FIG. 1B, during passband filtering, the desired 1 MHz signal (110) falls within the passband of a filter having the illustrated response curve (120), while the spectral images (141)–(148) fall within the stopband of the filter. High-quality filters with sharp cutoff frequencies are difficult to build, and are often expensive. A common way to reduce the cost of the filter is to use a higher sample clock frequency, $F_s$ (150), in order to move the spectral images further from the signal of interest.

FIG. 1C is a diagram that illustrates filtering in a DAC of conventional design utilizing a higher clock or sampling frequency, $F_s$ (150). Referring to FIG. 1C, filtering using the higher sample clock frequency (150) permits the use of a filter having a slower cutoff as shown by the response curve (120) illustrated in FIG. 1C. Such a response curve reduces the cost of the filter, when compared to filters having a sharper response. However, DACs that operate at the higher sampling frequency (150) are difficult to design, and are typically more expensive than those operating at lower frequencies. First-order as well as higher-order holds are possible, and are sometimes mentioned in research, but implementation is usually not practical.

Many conventional DACs are built from a number of switched current sources. There are several different arrangements for such switched current sources. A simple 10-bit DAC, for example, may have 10 binary-weighted current sources, or 1024 uniformly-weighted current sources. Switching the current sources on or off changes the output current proportional to the 10-bit digital input. Each digital value at the input is thereby converted into an analog current strength at the output. FIG. 1D is a block diagram of a conventional DAC.

Further limitations and disadvantages of conventional and traditional approaches will become apparent to one of ordinary skill in the art through comparison of such systems with the present invention as set forth in the remainder of the present application with reference to the drawings.

BRIEF SUMMARY OF THE INVENTION

A circuit, system and/or method of operation for an image cancelling digital-to-analog converter, substantially as shown in and/or described in connection with at least one of the figures, as set forth more completely in the claims.

These and other advantages and novel features of the present invention, as well as details of an illustrated embodiment thereof will be more fully understood from the following description and drawings.

DETAILED DESCRIPTION OF THE INVENTION

Aspects of the present invention relate to the conversion of digital data to analog values using digital-to-analog converters. More specifically, aspects of the present invention relate to a method and apparatus for a digital-to-analog converter having image canceling properties wherein spectral images in the output signal that are related to the input waveform and the sampling rate are reduced or eliminated.

Figure 2:
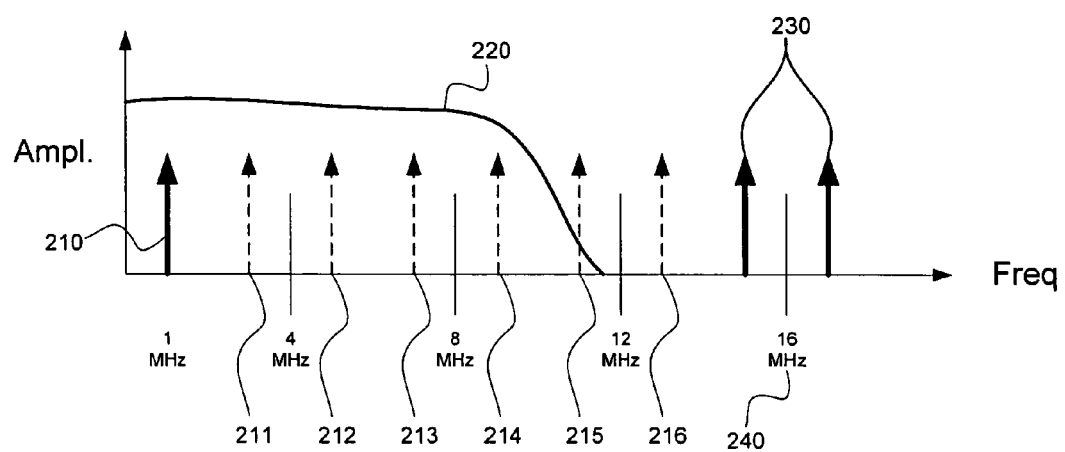
FIG. 2 shows a graph illustrating the reproduced 1 MHz signal, the spectral images spaced symmetrically about the 16 MHz effective DAC sampling frequency, and the cancelled spectral images that are avoided using an image canceling digital-to-analog converter (DAC) in accordance with an embodiment of the present invention.

In an embodiment of the invention, the invention clocks different parts of the DAC from different phases of the clock. Noise shaping may be utilized to shape the noise between phases of the clock. This simple, low-cost technique cancels the DAC spectral images, and gives the DAC the effective performance of a DAC with a higher clock frequency as illustrated in FIG. 2. In many cases, application of an embodiment of the present invention the invention is less expensive than traditional alternatives of using a higher sample clock rate, or a sharper low-pass filter at the DAC output.

FIG. 2 shows a graph illustrating the reproduced 1 MHz signal 210, the spectral images 230 spaced symmetrically about the 16 MHz effective DAC sampling frequency 240, and the cancelled spectral images 211–216 that are avoided using an image canceling digital-to-analog converter (DAC) in accordance with an embodiment of the present invention. The illustration of FIG. 2 also shows the response 220 of a filter that may be used to attenuate the remaining spectral images 230 that may be produced by an image canceling DAC in accordance with the present invention. The spectral images 230 produced by an embodiment of the present invention appear at a higher relative frequency within the spectrum shown in FIG. 2 than those of conventional DACs, as an image canceling DAC in accordance with the present invention is designed to eliminate the generation of lower-frequency spectral images. In this regard, a 4 MHz DAC with 4× image cancellation having the performance shown in the illustration of FIG. 2 has the effective performance of a 16 MHz DAC.

Figure 3:
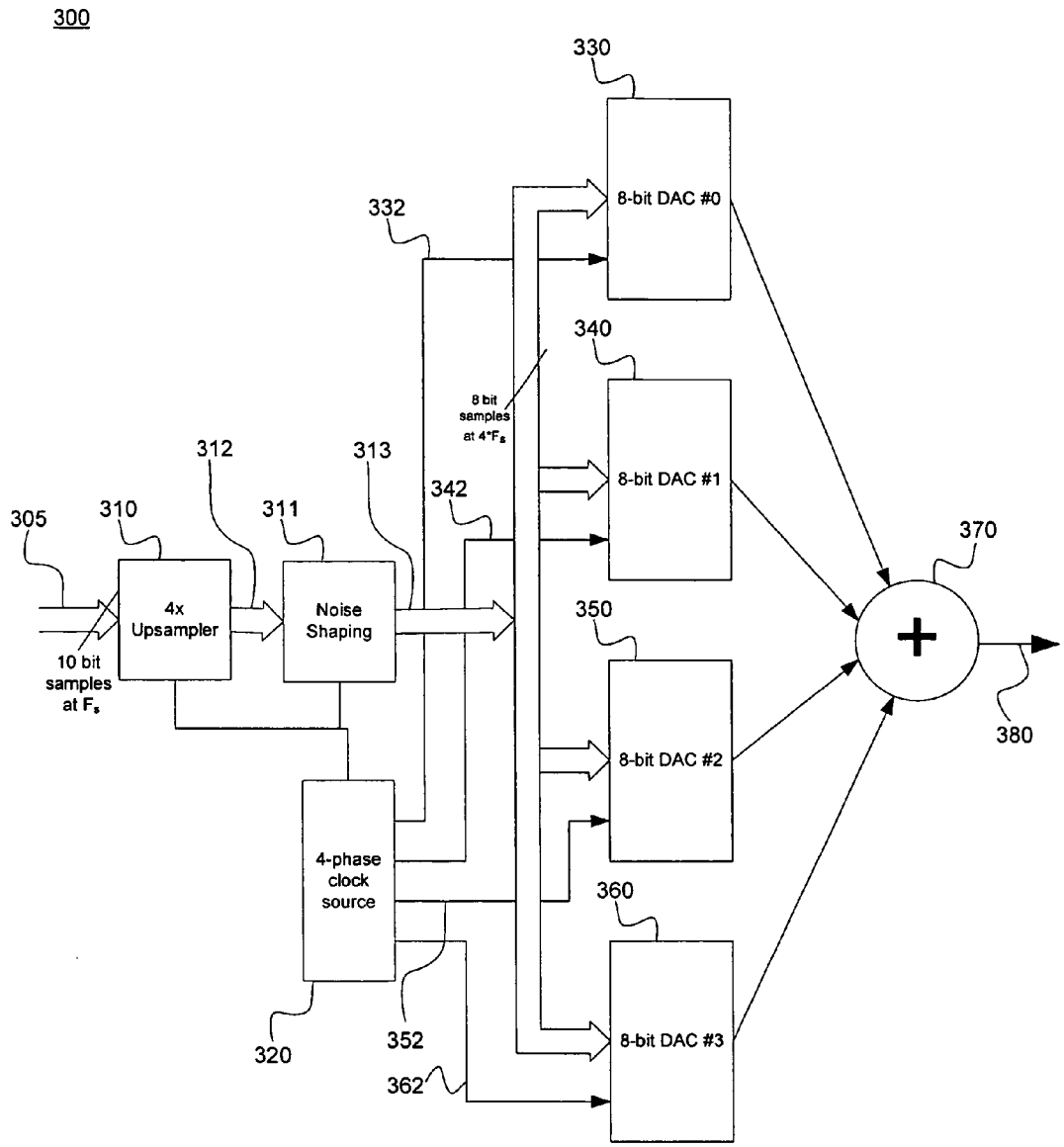
FIG. 3 is a block diagram of an exemplary image canceling DAC capable of converting 10-bit digitized samples into an analog output signal, in accordance with an embodiment of the present invention.
Figure 3A:
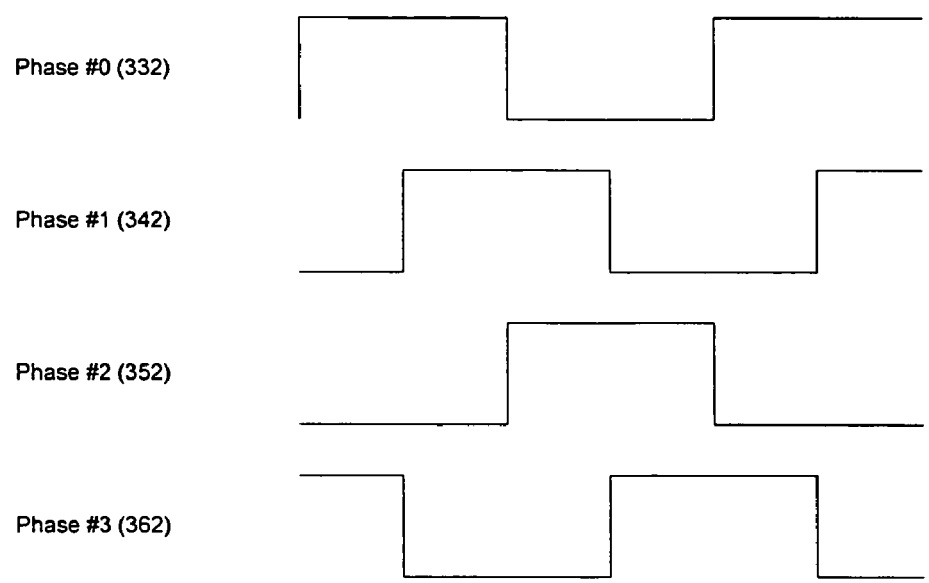
FIG. 3A shows a quadrature clock phase relationship of four clock phases #0 332, #1 342, #2 352, #3 362 that may be produced by, for example, the exemplary four-phase clock source 320, in accordance with an embodiment of the present invention.

FIG. 3 is a block diagram of an exemplary image canceling DAC 300 capable of converting 10-bit digitized samples 305 into an analog output signal 380, in accordance with an embodiment of the present invention. In an embodiment of the present invention, a DAC such as, for example, the 10-bit DAC of FIG. 1D may be modified by segmenting the 10-bit DAC into a plurality of smaller DACs, each DAC processing less than the full number of bits of the digitized sample stream. For example, the 10-bit DAC of FIG. 1D may be segmented into four (4) 8-bit DACs. In the illustration of FIG. 3, the image canceling DAC 300 comprises a 4× up-sampler 310, a noise shaper 311, a four-phase clock source 320, four 8-bit DACs 330, 340, 350, 360, and a combiner 370. The 4× up-sampler 310 accepts 10-bit digitized input samples 305 at a sampling frequency of $F_s$, and generates 8-bit samples at output 312 that are passed to noise shaper 311 at a sampling frequency of $4*F_s$. Although the example of FIG. 3 uses an up-sampling multiplier of four (4), the present invention is not limited in this regard and may be applied for any integer up-sampling rate greater than one (1). The 4× up-sampler 310 and noise shaper 311 process the 10-bit input samples 305 as described in greater detail, below. The output of the noise shaper 311 is then passed to the inputs of the four 8-bit DACs 330, 340, 350, 360. Operating in synchronism with the 4× up-sampler 310 and noise shaper 311, the four-phase clock source 320 produces four clock phases #0 332, #1 342, #2 352, #3 362 having the quadrature clock phase relationship shown in FIG. 3A. Each of the four clock phases #0 332, #1 342, #2 352, #3 362 is used for clocking, in a round-robin fashion, an 8-bit sample from the output 313 of the noise shaper 311 into one of the four 8-bits DACs 330, 340, 350, 360. In an embodiment of the present invention, the four 8-bit DACs 330, 340, 350, 360 may be either current or voltage output DACs. The four digital up-sampled and noise shaped values are sequentially converted by the four 8-bit DACs 330, 340, 350, 360. The outputs of the four 8-bit DACs 330, 340, 350, 360 are then passed to the combiner 370, that combines the four output signals into the combined output 380 of the image canceling DAC 300.

Figure 1A:
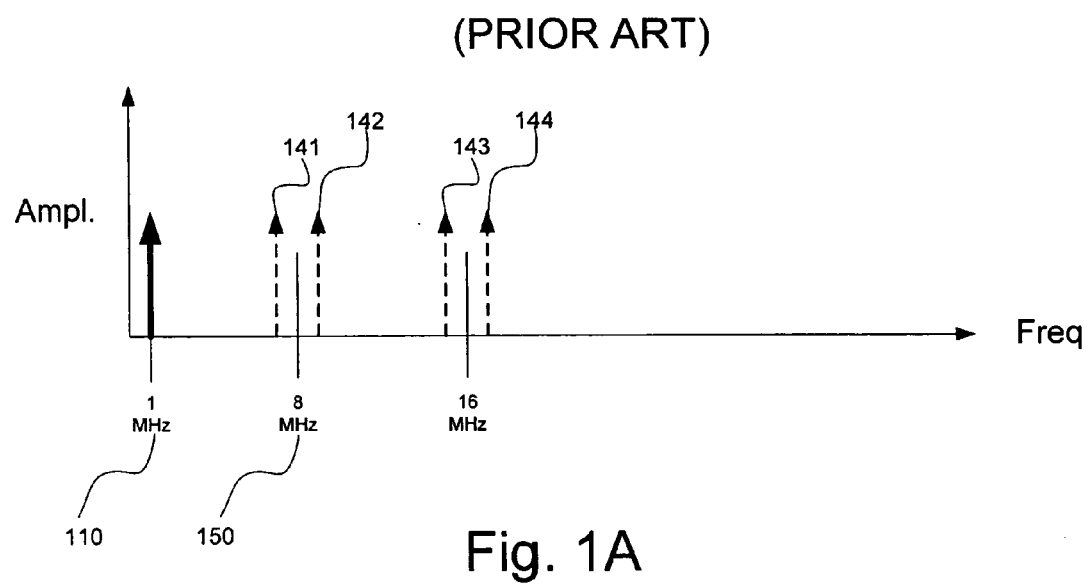
FIG. 1A illustrates some of the problems associated with spectral images for a DAC of conventional design.
Figure 1B:
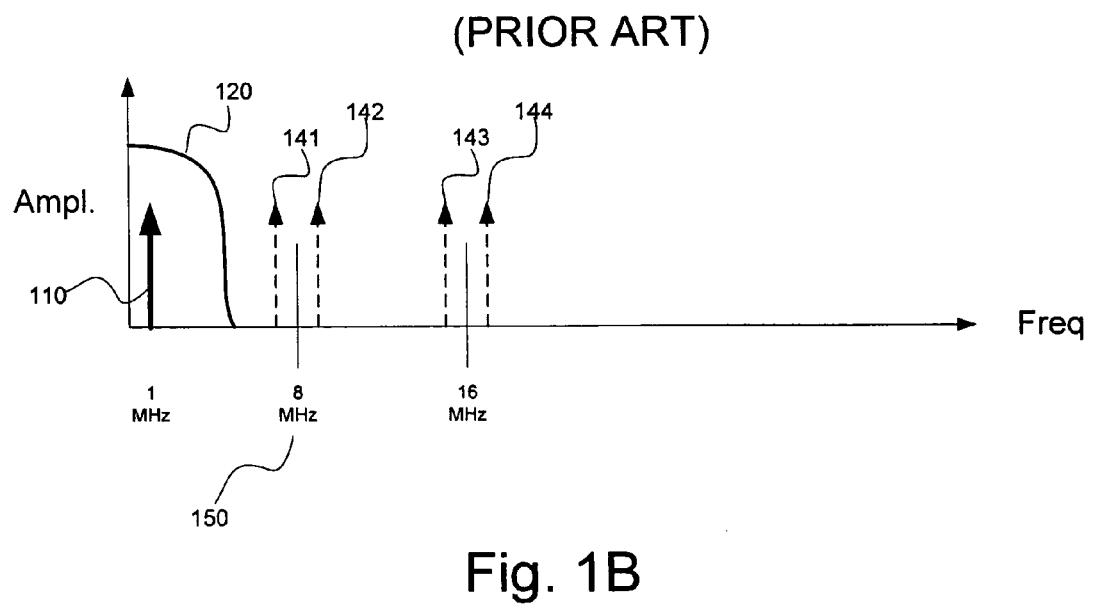
FIG. 1B illustrates suppression of the spectral images shown in FIG. 1A, by employing passband filtering of the output of a DAC of conventional design.
Figure 1C:
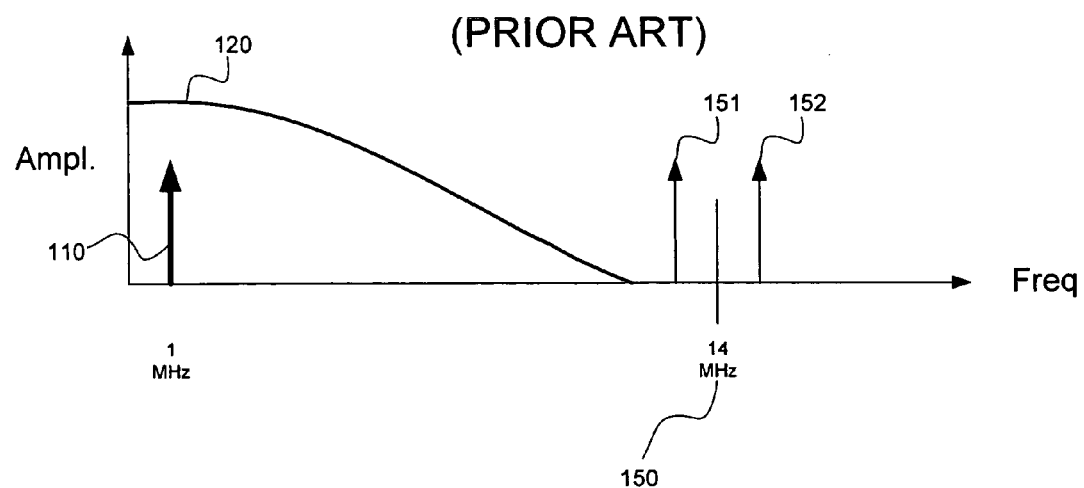
FIG. 1C is a diagram that illustrates filtering in a DAC of conventional design utilizing a higher clock or sampling frequency, Fs.
Figure 1D:
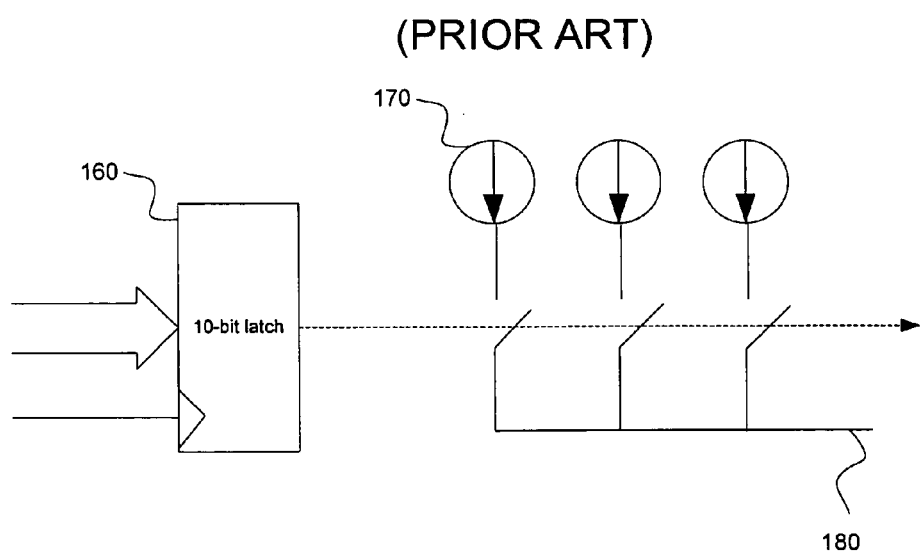
FIG. 1D is a block diagram of a conventional DAC.

Each of the four 8-bit DACs 330, 340, 350, 360 possesses ¼ the range of a DAC such as, for example, the 10-bit DAC shown in FIG. 1D. In an embodiment of the present invention, the least significant bit (LSB) of each of the four 8-bit DACs 330, 340, 350, 360 may be weighted such that a 1 LSB input change results in a DAC output change that is the same as the change in the output of the conceptually equivalent 10-bit DAC due to a 1 LSB input change. Because the four 8-bit DACs 330, 340, 350, 360 are clocked from four clock phases #0 332, #1 342, #2 352, #3 362, respectively, the four DACs 330, 340, 350, 360 of the image canceling DAC of FIG. 3 have the ability to accept samples at four times the original sample rate, $F_s$, as produced at the output 313 of the noise shaper 311. Each of the four 8-bit DACs 330, 340, 350, 360, however, is still clocked at the original sample rate, $F_s$, eliminating the need to use the high speed signal conversion circuitry that might otherwise be employed in a single conventional 10-bit DAC operating at the higher $4*F_s$ sampling rate.

Figure 4:
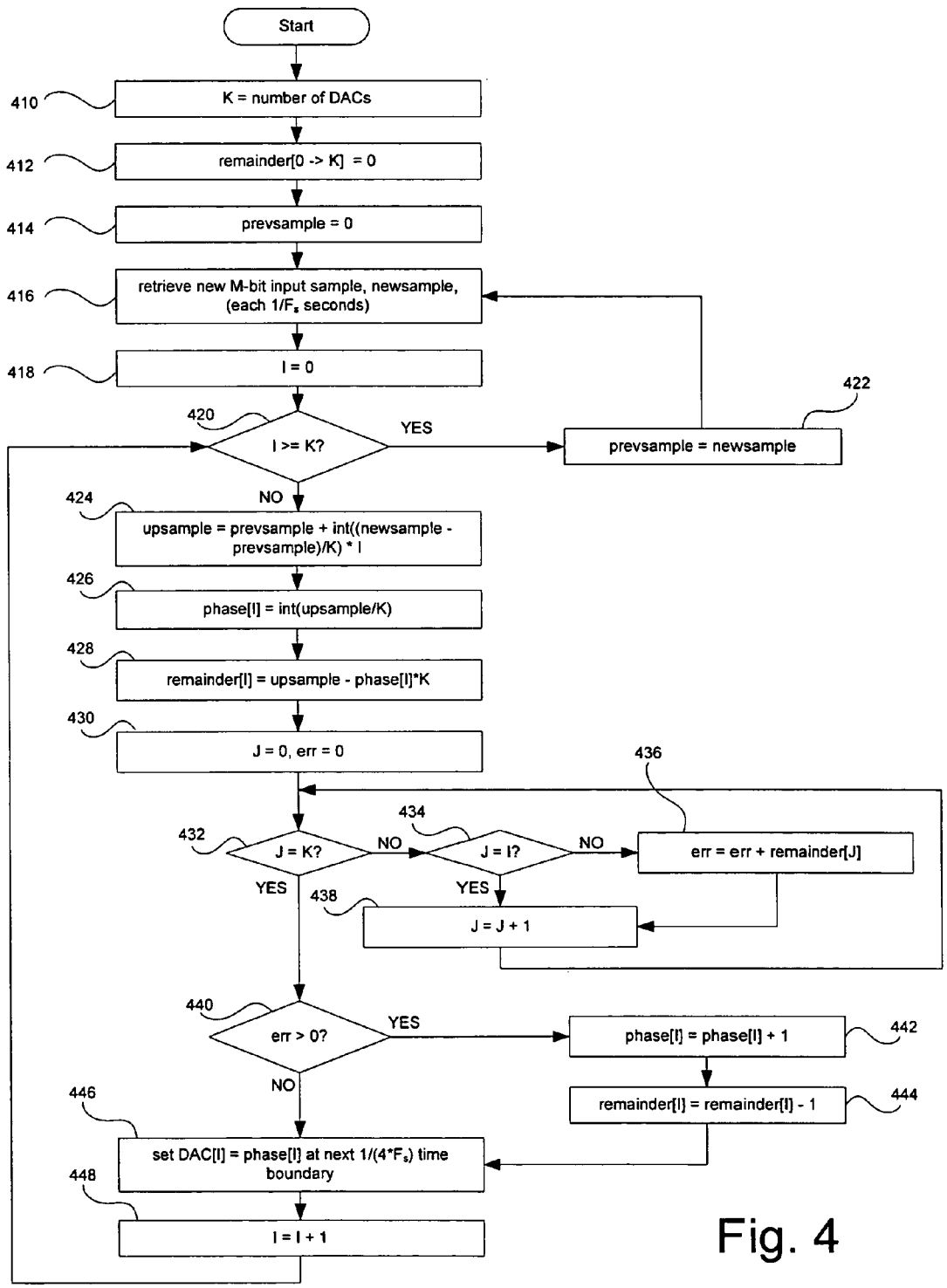
FIG. 4 shows a flowchart illustrating an exemplary method of operating an image canceling DAC such as, for example, the image canceling DAC of FIG. 3, in accordance with an embodiment of the present invention.

FIG. 4 shows a flowchart illustrating an exemplary method of operating an image canceling DAC such as, for example, the image canceling DAC 300 of FIG. 3, in accordance with an embodiment of the present invention. In an embodiment of the present invention, the four-times up-sampler 310 and noise shaper 311 may produce 8-bit samples for the four 8-bit DACs to be sequentially converted to an analog output signal in a round-robin fashion, according to the following method. The method of FIG. 4 begins when the number of DACs to be used in the production of the analog output signal is set to a value, K (block 410). For example, for the 10-bit image canceling DAC 300 of FIG. 3, the value of variable K may be set to 4, indicating the use of four DACs. The method then sets each of K values in an array variable, remainder, to zero (0) (block 412). The value of a variable, prevsample, is then set to zero (0) (block 414), because no previous sample has been processed.

Next, the method begins processing digitized input samples by receiving the first of a sequence of new M-bit digitized samples, at a sample rate, $F_s$, samples per second (block 416). To illustrate, for the 10-bit image canceling DAC 300 of FIG. 3, the value of M may be set to ten (10). The method of FIG. 4 then sets the value of a loop control variable, I, to zero (0) (block 418), in preparation for the generation and processing of K up-sampled values. A check is then made whether K up-sampled values have already been processed (block 420). If K up-sampled values have already been processed from the most recent digitized input sample, newsample, the most recent digitized input sample, newsample, is saved in a variable, prevsample, (block 422) and a new digitized input sample is retrieved from the sequence of M-bit digitized input samples (block 416). If K up-sampled values have not already been processed from the most recent M-bit digitized input sample, newsample, the next up-sample value, up-sample, is computed (block 424) using interpolation of K points between the previous input sample value, prevsample, and the new input sample value, newsample.

An initial value of the sample for the next DAC in sequence, phase[I], is then computed (block 426) by taking the integer portion of the value of the interpolated sample point divided by K. The remainder (or error) resulting from the calculation of an integer approximation of the interpolated value is then calculated and saved in remainder[I] (block 428). The method then calculates the total error, err, of the remainders for each of the previously generated K−1 interpolated points (blocks 432–438). The value of variable, err, is then tested to determined whether the total error is greater than zero (0) (block 440). If the value of the total error variable, err, is greater than zero (0), the value of the sample for the next DAC in sequence, phase[I], is adjusted by increasing it by one (1) (block 442), and the value of the variable, remainder, for the interpolated sample point is decreased by one (1) (block 444). The value of the sample for the next DAC in sequence, phase[I], is then output to the respective DAC at the next 1/(4*Fs) time boundary (block 446). The value of the loop variable, I, is then incremented (block 448), and the method returns to check whether further interpolated values of the variable, up-sample, are to be processed for the most recent digitized input sample (block 420).

If, however, the value of the total error variable, err, is less than or equal to zero (0) (block 440), the value of the sample for the next DAC in sequence, phase[I], is output, without adjustment, to the respective DAC at the next 1/(4*Fs) time boundary (block 446). The value of the loop variable, I, is then incremented (block 448), and the method returns to check whether further values of the variable, up-sample, are to be processed for the most recent digitized input sample (block 420).

Figure 5:
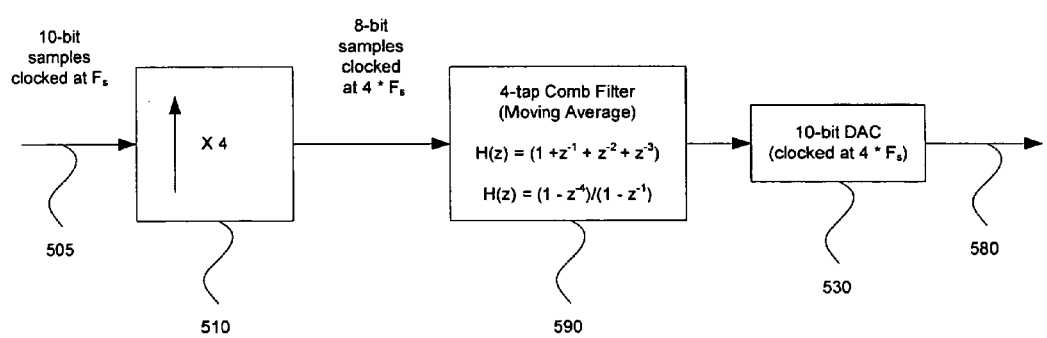
FIG. 5 shows a block diagram illustrating a mathematical model that may be used to analyze the expected behavior of an image canceling DAC, in accordance with an embodiment of the present invention.

FIG. 5 shows a block diagram illustrating a mathematical model that may be used to analyze the expected behavior of an image canceling DAC, in accordance with an embodiment of the present invention. The arrangement of FIG. 5 is mathematically equivalent to the exemplary image canceling DAC 300 of FIG. 3, but the digital-to-analog conversion has been moved after the summation. In the arrangement of FIG. 3, the four, 8-bit DACs effectively function as a 4-tap comb filter. The illustration of FIG. 5 also allows an understanding of the image cancellation property of an embodiment of a digital-to-analog converter in accordance with the present invention. The DAC illustrated in FIG. 3 is effectively operating at a sampling frequency of 4*$F_s$, and will gain all of the benefits of a DAC having a higher sampling rate. That is, in an embodiment of the present invention, the spectral images will be positioned further from the original signal, and from each other, and the DAC may benefit from noise shaping techniques, described below.

Figure 6:
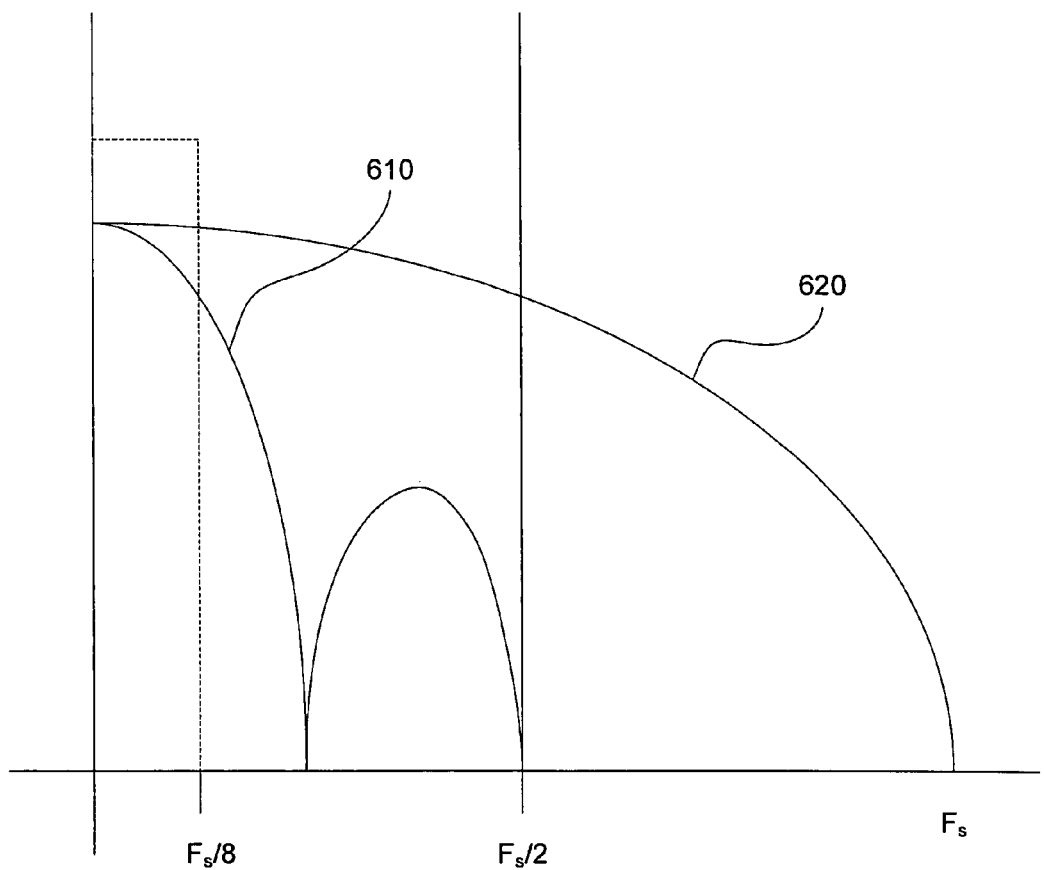
FIG. 6 shows a graph illustrating the attenuation of the 4-tap comb filter of FIG. 5, in accordance with an embodiment of the present invention.

FIG. 6 shows a graph illustrating the attenuation of the 4-tap comb filter 520 of FIG. 5, in accordance with an embodiment of the present invention. The 4-tap comb filter 520 functions as a low-pass filter, and attenuates the output of the DAC 530 of FIG. 5 at high frequencies. Because the original signal input 505 is sampled at $F_s$, it is a low frequency signal when compared to the sample clock of the DAC 530, that operates at 4*$F_s$. The curve 610 shows the additional roll-off from the comb filter 520 of FIG. 5, that imparts significant attenuation at high frequencies. The curve 620 shows the attenuation that is characteristic of all sample-and-hold DACs, and illustrates the 6 dB attenuation at f=0.6 $F_s$. The roll-off of curve 620 may be represented as:

$$\mathrm{sinc}\ (\pi * f/F_s)$$

In an embodiment of the present invention, the digital values distributed to the K digital-to-analog converters may first be adjusted using noise shaping provided by a noise shaping function such as the noise shaper 311 shown in FIG. 3. If each of the original 10-bit digitized samples 305 is first up-sampled at a sampling rate of 4*$F_s$, truncated to an 8-bit value, and converted to an analog value, the resulting analog signal exhibits the performance of only an 8-bit DAC. An embodiment of the present invention, however, uses a novel application of noise shaping to recover a significant amount of the performance of a 10-bit DAC, by shaping the noise across all phases of the sampling clock. This results in an averaging of the quantization noise from, for example, each individual 8-bit DACs 330, 340, 350, 360 of FIG. 3. The noise shaping function in an embodiment of the present invention may be performed using any of a number of noise shaping arrangements such as, for example, a sigma-delta approach. The applicant has observed good performance in an Nx image canceling DAC using an N-tap moving average, that will average the quantization error across each of the N smaller DACs.

Table 1, below, illustrates the operation of a 4-tap moving average filter for noise shaping in an image canceling DAC in accordance with an embodiment of the present invention. The values shown in Table 1 illustrate the values of variables used in the method diagramed in FIG. 4, for a 10-bit (M=10) image canceling DAC employing four (K=4) 8-bit DACs. The 10-bit input sample values in the example of Table 1 may be assumed to be a linear ramp.

TABLE 1

| 10-bit input sample at $F_s$ | up-sample | phase[I] | remainder | output = sum(phase[0–3]) | ideal output |
|---|---|---|---|---|---|
| 800 | 800 | 200 | 0/4 | | |
| | 825 | 206 | 1/4 | | |
| | 850 | 213 | −2/4 | | |
| | | (212 + 1) | (2/4 − 1) | | |
| | 875 | 218 | 3/4 | 200 + 206 + 213 + 218 = 837 | 837.5 (+) |
| 900 | 900 | 226 | −4/4 | 206 + 213 + 218 + 226 = 863 | 862.5 (−) |
| | | (225 + 1) | (0/4 − 1) | | |
| | 925 | 231 | 1/4 | 213 + 218 + 226 + 231 = 888 | 887.5 (−) |

TABLE 1-continued

| 10-bit input sample at $F_s$ | up-sample | phase[I] | remainder | output = sum(phase[0–3]) | ideal output |
|---|---|---|---|---|---|
| | 950 | 237 | 2/4 | 218 + 226 + 231 + 237 = 912 | 912.5 (+) |
| | 975 | 243 | 3/4 | 226 + 231 + 237 + 243 = 937 | 937.5 (+) |

As illustrated in the method of FIG. 4 and the values in the columns of Table 1, in an embodiment of the present invention, the original 10-bit digitized samples 305 may be interpolated (e.g., in FIG. 3 and Table 1, by a factor of 4×) to create an up-sampled linear ramp [e.g., 800, 825, 825, 875, etc.]. The up-sampled values then undergo noise shaping, and are distributed to a number of smaller DACs. In the examples of FIG. 3 and Table 4, the number of DAC used is four (i.e., 8-bit DACs 330, 340, 350, 360). For example, the first 10-bit input sample value [800] is sent to the first DAC as [800/4=200+0/4.] Each time a value is sent to a DAC, the remainder of the division is fed back to the next three calculations. For example, in the third row of Table 1, the value [850/4=212+2/4] "sees" the remainders [0/4, 1/4] from previous two calculations. The sum of these earlier two calculations is greater than zero, and results in the value, phase[I], being rounded up to 213 [850/4=212+1], and the original remainder value being adjusted by decrementing it to −2/4 [−2/4=2/4−1].

To illustrate another example, in row five of Table 1, the value 225 [225=900/4] with a remainder of +0/4, "sees" the remainders [1/4, −2/4, 3/4] from the prior three calculations. Because the sum of the remainders is less than or equal to zero, the value, phase[I], [225] is not rounded up, and the remainder is not decremented.

In an embodiment in accordance with the present invention, such as that shown in FIG. 3 and Table 1, the phases of an image canceling DAC cooperate in this manner to minimize the total error at the output. To illustrate, the two rightmost columns of Table 1 show the sum of the outputs of the four 8-bit DACs, and the "ideal" output. Note that the output of the four DACs in the example is always within ½ LSB of the ideal output, and tends to oscillate +½, −½ in an attempt to have zero average error.

The applicant has performed simulations showing that an image canceling DAC according to an embodiment of the present invention exhibits many of the properties of a DAC clocked at N times that sample rate of the original digitized input values. For example, low-frequency spectral images are cancelled, and the signal-to-noise (SNR) is as good as a traditional DAC. An image canceling DAC in accordance with an embodiment of the present invention has the same sinc roll-off as a DAC clocked at N times the original, lower sample rate. Such a DAC also has a second roll-off due to the summation of the different phases from the individual smaller DACs. This second roll-off is the same as the roll-off from an N-tap moving average (or comb) filter. An image canceling DAC in accordance with an embodiment of the present invention may permit the reproduction of signals at frequencies beyond the Nyquist limit of $F_s/2$. The Nyquist limit for an Nx image cancellation DAC is $N*F_s/2$.

The image cancellation technique of an embodiment of the present invention may be applied to almost any digital-to-analog converter application. Although the above description provided examples that utilized 4× image cancellation on a 10-bit current DAC, the present invention is not limited in this regard. An embodiment in accordance with the present invention may have application in almost any system in which digital-to-analog conversion is used. Accordingly, the present invention is not limited, for example, to 10-bit DACs, or current DACs, or DACs built from uniformly weighted current sources.

Figure 7:
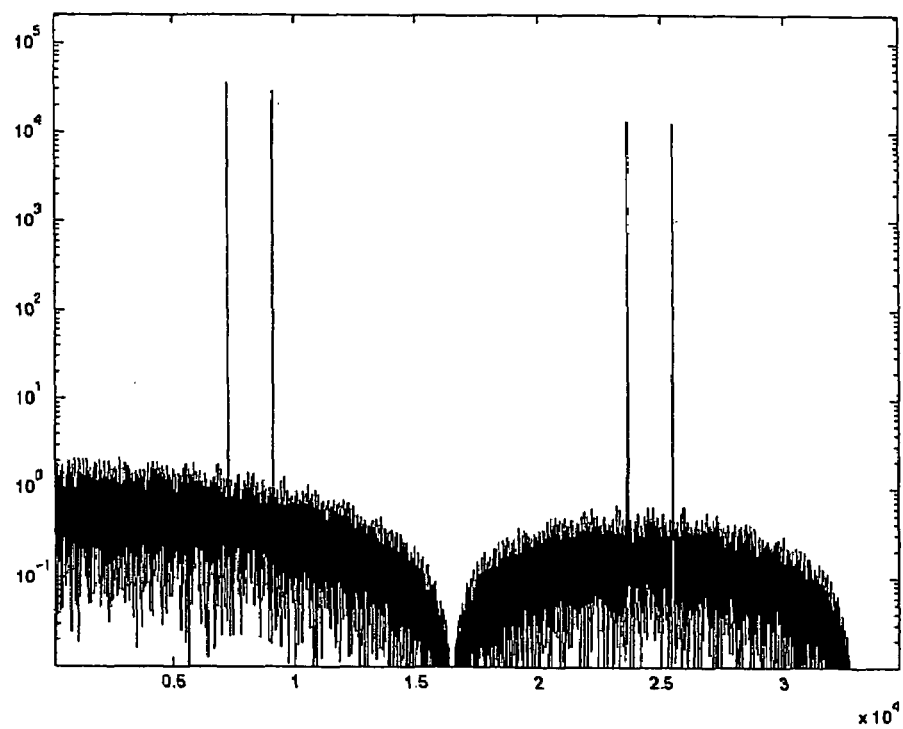
FIG. 7 illustrates the simulated output frequency spectrum for a standard or conventional 10-bit DAC reproducing a 60.123 MHz input signal at a sample rate of 108 MHz.

FIG. 7 illustrates the simulated output frequency spectrum for a standard or conventional 10-bit DAC reproducing a 60.123 MHz input signal 710 at a sample rate of 108 MHz. Each output is repeated for 4 clock cycles to show the images. Because the 60.123 MHz input signal is beyond the Nyquist limit, there is a spectral image 720 at approximately 108−60=48 MHz. Additional spectral images 730, 740 also exist at roughly 108+60=168 MHz, and 216−60=156 MHz, respectively. The illustration of FIG. 7 shows a frequency range of approximately zero (0) MHz to 216 MHz.

Figure 8:
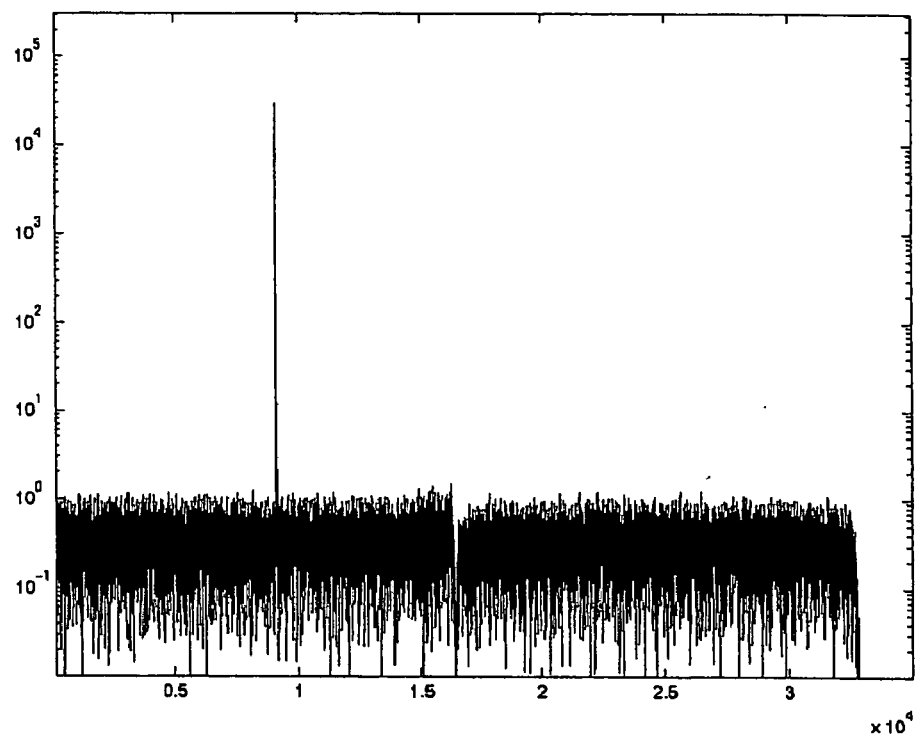
FIG. 8 illustrates the simulated output frequency spectrum for an exemplary 108 MHz 4× image canceling DAC reproducing a 60.123 MHz input signal, in accordance with an embodiment of the present invention.

FIG. 8 illustrates the simulated output frequency spectrum for an exemplary 108 MHz 4× image canceling DAC reproducing a 60.123 MHz input signal 810, in accordance with an embodiment of the present invention. Each of the four DAC sections of the simulated image canceling DAC of FIG. 8 is limited to 256 levels (8 bits). Note that no spectral images are present—even the spectral image at 108−60=48 MHz is suppressed. The noise floor and signal amplitude of the image canceling DAC of FIG. 8 are both comparable to a standard 10-bit DAC, such as for the standard or conventional DAC shown in FIG. 1D.

The following C-language code example may be utilized to illustrate the operation of a 4× image canceling DAC such as, for example, the image canceling DAC of FIG. 3, in accordance with an embodiment of the present invention.

```
// C model of 4x anti-alias DAC
#include <stdio.h>
#include <stdlib.h>
#include <string.h>
#include <math.h>
// set SCALE to 1 for a normal DAC, 4 for anti-alias DAC
#define SCALE 4
int main(int argc, char *argv[ ]) {
   double freq, dither, in, dsum;
   int out, x, y, phase, sum;
   int dacs[4] = {0,0,0,0};
   double err[4] = {0,0,0,0};
   // 60.123 MHz input signal, sampled at 108MHz
   freq = 3.14159 * 2.0 * 60123.0 / 108000.0;
   out = 0;
   phase = 0;
   dither = 0.0;
   // Effectively oversample by dividing frequency by SCALE
   freq /= SCALE;
   // Run through 25000 samples
   for (x = 0; x < 25000*SCALE; x++) {
      in = sin (x * freq) * 480 + 512; // 10-bit DAC range [0,1023]
      dither = (double) (rand( ));
      dither = dither / 32768.0 − 0.5;
      // sum errors from all other phases
      err[phase] = 0.0;
```

-continued

```
    dsum = 0.0;
    for (y = 0; y < SCALE; y++) {
        // a small 0.95 scale factor seems to add stability
        dsum += err[y] * 0.95;
    }
    // update this DAC and phase
    dacs[phase] = int(dsum + dither + in/SCALE);
    err[phase] = ((in/SCALE) - dacs[phase]);
    // check to make sure DAC is only a fraction of the full 10-bit range
    if((dacs[phase] > (1024 / SCALE)) || (dacs[phase] < 0)) {
        fprintf(stderr, "Range Error: %d, %d\n", phase, dacs[phase]);
    }
    // sum all dacs, and print output
    // repeat output to show images
    sum = -512; // remove DC offset
    for (y = 0; y < SCALE; y++) {
        sum += dacs[y];
    }
    printf("%d\n", sum);
    if (SCALE == 1) {
        printf("%d\n", sum);
        printf("%d\n", sum);
        printf("%d\n", sum);
    }
    // increment phase
    phase++;
    if (phase >= SCALE) {phase = 0;}
    }
}
```

Aspects of the present invention may be found in an image canceling digital-to-analog converter (DAC) comprising an up-sampler, a clock source, a plurality of digital-to-analog converters, a combiner, and a noise shaper. In an embodiment of the present invention, the up-sampler may receive a first stream of digital values at a first sample rate. The first stream of digital values may be representative of a first signal, and each of the digital values may comprise a first number of bits. The up-sampler may produce, at a second sample rate, a second stream of digital values based upon the first stream of digital values. The clock source may produce a plurality of clock signals substantially equally spaced in time. Each of the plurality of digital-to-analog converters may periodically accept, under control of one of the plurality of clock signals, a digital value from the second stream of digital values, and the outputs from the plurality of digital-to-analog converters may form a plurality of analog output signals. The combiner may be adapted to combine the plurality of analog output signals to form a combined output signal, and the noise shaper may adjust selected digital values of the second stream of digital values in order to minimize spectral images in the combined output signal.

In an embodiment in accordance with the present invention, the first sample rate may be less than the second sample rate, and the first number of bits may be greater than the second number of bits. The first stream may comprise 10-bit digital values, the second stream may comprise 8 bit digital values, and the plurality of digital-to-analog converters may comprise four digital-to-analog converters. The combiner in an embodiment of the present invention may add the plurality of analog output signals to form the combined output signal, and the noise shaper may implement a four-tap moving average filter. The noise shaper may be adapted to minimize total error in the combined output signal.

Additional aspects of the present invention may be seen in a method of operating an image canceling digital-to-analog converter (DAC). Such a method may comprise receiving a first stream of digitized signal samples, up-sampling the first stream of digitized signal samples to produce a second stream of digitized signal samples, and performing noise shaping upon the second stream of digitized signal samples. An embodiment of the present invention may also comprise sequentially converting to analog output signals, in a round-robin fashion, each of a predetermined number of samples of the second stream of digitized signal samples, and combining the analog output signals to produce a combined output signal. The noise shaping may be adapted so as to minimize spectral images in the combined output signal.

In an embodiment of the present invention, samples of the first stream may comprise a relatively greater number of bits, and samples of the second stream may comprise a relatively lesser number of bits. Samples of the first stream may comprise 10 bits, and samples of the second stream may comprise 8 bits. The sampling rate of the first stream may be a relatively lower sampling rate, and the sampling rate of the second stream may be a relatively higher sampling rate. The sampling rate of the second stream may be an integer multiple of the sampling rate of the first stream, for integer values greater than or equal to 2. The noise shaping may be adapted to minimize total error in the combined output signal, and the noise shaping may apply a 4-tap moving average filter to the samples of the second stream. The combining may add the analog output signals to form the combined output signal.

Further aspects of the present invention may be observed in a machine-readable storage, having stored thereon a computer program having a plurality of code sections executable by a machine for causing the machine to perform the operations of the method described above.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. An image canceling digital-to-analog converter (DAC) comprising:
    a noise shaping circuit;
    a plurality of digital-to-analog converters;
    a combining circuit for producing a combined output from the plurality of digital to analog converters; and
    wherein the noise shaping circuit modifies selected samples of an upsampled digital signal sample stream before periodic distribution of successive samples to a respective one of the plurality of digital to analog converters in a cyclic fashion at essentially equally spaced points in time.

2. The image canceling digital-to-analog converter of claim 1, further comprising an upsampling circuit producing upsampled digital signal samples from a received stream of digital signal samples.

3. The image canceling digital-to-analog converter of claim 1, wherein each sample distributed to one of the plurality of digital-to-analog converters comprises fewer bits than each upsampled digital signal sample.

4. The image canceling digital-to-analog converter of claim 1, further comprising a clock circuit producing a plurality of clock signals each initiating conversion by a corresponding one of the plurality of digital-to-analog converters.

5. A method of operating an image cancelling digital to analog converter, the method comprising:
    upsampling each sample of a first stream of digital signal samples to produce N samples of a second stream of digital signal samples;
    modifying samples of the second stream;
    sequentially converting successive samples of the modified second stream in a cycle of N conversions at essentially equally spaced points in time, to form N analog signals; and
    combining the N analog signals to produce an output signal.

6. The method of claim 5, wherein the modifying comprises filtering the samples of the second stream using a moving average filter having N taps.

7. The method of claim 5, wherein each converted sample has K fewer bits than each sample of the first stream of digital signal samples, and wherein $N=2^k$.

8. The method of claim 5, wherein N is greater than or equal to 2.

9. A machine-readable storage, having stored thereon a computer program having a plurality of code sections for operating an image cancelling digital to analog converter, the code sections executable by a machine for causing the machine to perform the operations comprising:
    upsampling each sample of a first stream of digital signal samples to produce a number N samples of a second stream of digital signal samples;
    modifying samples of the second stream;
    sequentially converting successive samples of the modified second stream in a cycle of N conversions at essentially equally spaced points in time, to form N analog signals; and
    combining the N analog signals to produce an output signal.

10. The machine-readable storage of claim 9, wherein the modifying comprises filtering the samples of the second stream using a moving average filter having N taps.

11. The machine readable storage of claim 9, wherein each converted sample has K fewer bits than each sample of the first stream of digital signal samples, and where $N=2^K$.

12. The machine readable storage of claim 9, wherein N is greater than or equal to 2.

13. A method of operating an image canceling digital-to-analog converter circuit for converting a first digital sample stream representative of a first signal, the method comprising:
    processing each sample of the first digital sample stream to produce a second digital sample stream;
    converting a plurality of successive samples of the second stream at essentially equally-spaced points in time to produce a corresponding plurality of analog signals; and
    combining the plurality of analog signals to produce a combined output signal representative of the first digital sample stream.

14. The method of claim 13, wherein a sample of the first stream comprises a greater number of bits than a sample of the second stream.

15. The method of claim 13, wherein the second stream comprises a relatively larger number of samples per unit time and the first stream comprises a relatively smaller number of samples per unit time.

16. The method of claim 13, wherein the processing comprises:
    upsampling the first digital sample stream; and
    filtering the upsampled first sample stream.

17. A system supporting digital-to-analog conversion of a stream of digital signal samples to an analog output signal, the system providing cancellation of spectral images in the analog output signal, the system comprising:
    digital signal processing circuitry for upsampling the stream of digital signal samples, and for modifying the upsampled stream to form a plurality of streams of modified digital signal samples;
    a clock circuit for producing clocking signals that periodically enable digital-to-analog conversion, essentially equally spaced in time, of sequential samples from each of the plurality of streams of modified digital signal samples; and
    wherein the digital to-analog conversions of samples of a stream of modified digital signal samples produce a corresponding one of a plurality of analog signals for combining to form the analog output signal.

18. The system of claim 17, further comprising:
    a plurality of digital-to-analog converters, each for converting a sequence of samples from a corresponding one of the plurality of streams of modified digital signal samples to an analog signal, based upon the clocking signals.

19. The system of claim 17, further comprising:
    combiner circuitry for producing the analog output signal from the plurality of analog signals.

20. The system of claim 19, wherein the combiner sums the plurality of analog signals.

21. The system of claim 17, wherein the modification of the upsampled stream comprises reducing a number of bits in samples of the upsampled stream.

22. The system of claim 17, wherein the modification of the upsampled stream comprises applying a filter to the upsampled stream of digital signal samples.

23. An image canceling digital-to-analog converter (DAC) comprising:
    a plurality of digital-to-analog converters that collectively receive a single stream of samples at a first sampling rate, and that individually operate at a second sampling rate lower than the first sampling rate; and a combiner for producing a combined output from the plurality of digital to analog converters.

24. The image canceling digital-to-analog converter (DAC) of claim 23, wherein the combiner produces the combined output from the plurality of digital to analog converters such that the combined output appears as if a single conversion of the stream of samples occurred at the first sampling rate.

25. The image canceling digital-to-analog converter (DAC) of claim 23, wherein the combined output is substantially devoid of spectral images.

26. An image canceling digital-to-analog converter (DAC) comprising:
  an upsampler that receives a first stream of samples at a first sampling rate, and that produces a second stream of samples at a higher sampling rate than the first stream of samples, and wherein samples of the second stream have fewer bits than samples of the first stream of samples;
  a noise shaper for modifying samples of the second stream of samples;
  a plurality of digital-to-analog converters, each converter operating at the sampling rate of the first stream of samples; and
  a combiner for producing a combined output from the plurality of digital-to-analog converters.

27. An image canceling digital-to-analog converter (DAC) comprising:
  signal processing circuitry that receives, at a first sampling rate, a first stream of samples representative of an analog signal, and that produces, at a sampling rate higher than the first sampling rate, a second stream of samples;
  a plurality of digital-to-analog converters that receive the second stream of samples, each digital-to-analog converter operating at the first sampling rate; and
  a combiner for producing a combined output from the plurality of digital-to-analog converters.

28. The image canceling digital-to-analog converter of claim 27, wherein the combined output is substantially devoid of spectral images.

29. The image canceling digital-to-analog converter of claim 27, wherein the combined output is substantially devoid of spectral images below a frequency corresponding to about the second sampling rate.

30. The image canceling digital-to-analog converter of claim 27, wherein each of the plurality of digital-to-analog converters has fewer bits of resolution than each sample of the first stream of samples.

31. The image canceling digital-to-analog converter of claim 27, wherein the signal processing circuitry comprises:
  an upsampler that receives the first stream of samples and produces a second stream of samples at the second sampling rate, each sample of the second stream of samples having fewer bits than a sample of the first stream of samples; and
  a noise shaper that modifies samples of the second stream of samples.

* * * * *